(12) United States Patent
Brintzinger et al.

(10) Patent No.: US 7,235,859 B2
(45) Date of Patent: Jun. 26, 2007

(54) ARRANGEMENT AND PROCESS FOR PROTECTING FUSES/ANTI-FUSES

(75) Inventors: Axel Brintzinger, Dresden (DE); Octavio Trovarelli, Dresden (DE); David Wallis, Dresden (DE); Wolfgang Leiberg, Dresden (DE)

(73) Assignee: Infineon Technologies AG, Munich (DE)

( * ) Notice: Subject to any disclaimer, the term of this patent is extended or adjusted under 35 U.S.C. 154(b) by 132 days.

(21) Appl. No.: 10/957,492

(22) Filed: Oct. 1, 2004

(65) Prior Publication Data

US 2005/0258506 A1 Nov. 24, 2005

(30) Foreign Application Priority Data

Oct. 2, 2003 (DE) ................ 103 46 460

(51) Int. Cl.
*H01L 29/00* (2006.01)
(52) U.S. Cl. ................ 257/529; 257/E23.149
(58) Field of Classification Search ........ 257/529, 257/E23.149
See application file for complete search history.

(56) References Cited

U.S. PATENT DOCUMENTS

| | | | |
|---|---|---|---|
| 5,028,983 A | 7/1991 | Bickford et al. | |
| 5,789,794 A | 8/1998 | Froehner | |
| 5,827,759 A | 10/1998 | Froehner | |
| 5,856,233 A * | 1/1999 | Bryant et al. | 438/600 |
| 6,677,226 B1 * | 1/2004 | Bowen et al. | 438/601 |
| 2003/0054592 A1 * | 3/2003 | Farnworth et al. | 438/130 |
| 2003/0085446 A1 * | 5/2003 | Song et al. | 257/530 |

FOREIGN PATENT DOCUMENTS

| | | |
|---|---|---|
| DE | 196 04 776 A1 | 8/1997 |
| DE | 198 00 566 A1 | 7/1999 |
| DE | 101 23 686 C1 | 3/2003 |
| KR | 1996-26749 | 7/1996 |
| KR | 100190100 B1 | 1/1999 |

OTHER PUBLICATIONS

Peter Van Zant, Microchip Fabrication, 4th edition, McGraw—Hill, p. 154.*

* cited by examiner

Primary Examiner—Jerome Jackson
Assistant Examiner—Mohammad Timor Karimy
(74) Attorney, Agent, or Firm—Slater & Matsil, L.L.P.

(57) ABSTRACT

An arrangement for protecting fuses/anti-fuses on chips which serve to activate redundant circuits or chip functions includes a passivation layer (e.g., hard passivation) arranged on a fully processed chip with the exception of metal contacts of a metallization level and the fuses. The chip is provided with a redistribution layer that is electrically contact-connected to the metallization level, and to a process for protecting such fuses/anti-fuses. The invention is now based on the object of ensuring sufficient protection of fuses/anti-fuses on integrated circuits. This is achieved by virtue of the fact that a dielectric (3.1, 3.2), which covers at least the region of the fuses/anti-fuses (4) and to which the redistribution layer (2) comprising the combination of materials Cu/Ni/Au is applied, is arranged on the passivation layer (5).

25 Claims, 1 Drawing Sheet

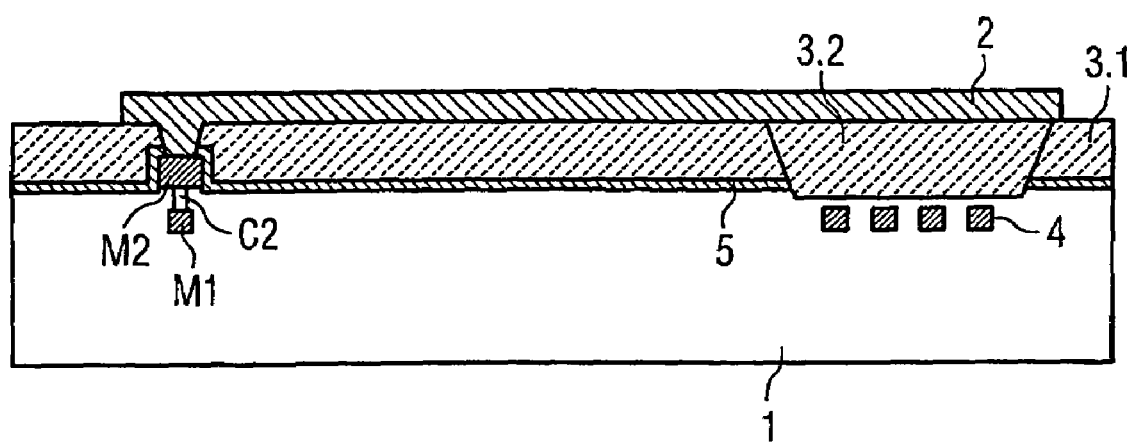

ARRANGEMENT AND PROCESS FOR PROTECTING FUSES/ANTI-FUSES

This application claims priority to German Patent Application 103 46 460.3, which was filed Oct. 2, 2003, and is incorporated herein by reference.

TECHNICAL FIELD

The present invention relates generally to semiconductor devices, and more particularly to an arrangement and process for protecting fuses and anti-fuses.

BACKGROUND

In many cases, redundant circuits or a plurality of functions are also integrated in integrated circuits in order to allow them to be activated on demand. Redundant circuits of this type are activated if, as a result of incorrect processing (e.g., defects, particles), individual circuit parts are unable to function. The redundant circuits then perform the role of the defective circuits and the chip as a whole remains fully functional.

To activate the redundant circuit or function, the integrated circuit is electrically isolated from the defective region and connected to a redundant circuit (replacement circuit). This is achieved by fuses for disconnecting current paths and anti-fuses for connecting current paths.

An example of a disconnectable connection bridge (fuse) and a connectable line interrupter (anti-fuse) and of a process for producing and activating a fuse and an anti-fuse is disclosed by DE 196 04 776 A1.

These fuses have hitherto been integrated in one of the metallization levels of the integrated circuit. To break a fuse, a laser beam is directed onto the fuse and a short pulse of current is then responsible for melting through the fuse.

After processing of the chips has been completed, the chips are electrically tested for functionality before being mounted, for example in a housing. Non-functioning chips are repaired using the fuses as described above before being mounted.

If this described process is carried out directly by the manufacturer and if these chips (KGDs: known good dies) are mounted on substrates and over-molded, the fact that the fuses/anti-fuses are uncovered does not actually present problems, since the chip is sufficiently protected from environmental influences by the over-molding.

However, if chips are delivered to the customer in unpackaged form (bare chips or bare dies), and the customer then mounts the chips himself, considerable reliability problems are encountered. For example leakage currents, corrosion, erosion, etc. can result from environmental influences. There is then the considerable risk that fuses will be undesirably broken or anti-fuses will be undesirably connected, which can result in chip malfunctioning, even to the extent of the chip being rendered unusable.

To avoid these reliability problems, a silicon oxide or a silicon nitride or mixed layers can be deposited on the surface of the chip (wafer). But this approach would be very expensive and complex.

SUMMARY OF THE INVENTION

In one aspect, the invention relates to an arrangement for protecting fuses/anti-fuses on chips which serve to activate redundant circuits or chip functions. A passivation layer (e.g., hard passivation) is arranged on the fully processed chip with the exception of metal contacts of one of the metallization levels (e.g., the second metal or M2) and the fuses. The chip is provided with a redistribution layer that is electrically contact-connected to the metallization level, and to a process for protecting such fuses/anti-fuses.

Therefore, the preferred embodiment of the invention provides an arrangement for protecting fuses/anti-fuses on integrated circuits, which avoids the drawbacks of the prior art. Furthermore, embodiments of the invention provide a process for protecting such fuses/anti-fuses.

In an arrangement of the type described above, aspects of the invention can be achieved by providing a dielectric that covers at least the region of the fuses/anti-fuses and to which the redistribution layer is applied. Preferably, the redistribution layer comprises a combination of materials such as Cu/Ni/Au and is arranged on the passivation layer.

The material used as dielectric may be a metal oxide, a silicon oxide, a silicon nitride or a low-K or high-K dielectric, or another non-conductor.

A process includes the application of a polyimide, patterning of the polyimide, terminal via etch, application of a dielectric, patterning of the dielectric and processing of the redistribution layer comprising a standard layer structure of Cu/Ni/Au.

BRIEF DESCRIPTION OF THE DRAWINGS

The invention is to be explained in more detail below on the basis of an exemplary embodiment. The associated drawing diagrammatically depicts a chip 1 (die) having a redistribution layer 2 (rewiring) and a dielectric 3 located beneath it.

The following list of reference symbols can be used in conjunction with the FIGURE:

| | |
|---|---|
| 1 | Chip |
| 2 | Redistribution layer |
| 3.1 | Dielectric 1 |
| 3.2 | Dielectric 2 |
| 4 | Fuse/anti-fuse |
| 5 | Passivation |
| M1 | Metallization |
| M2 | Metallization |
| C2 | Through-contact/via |

DETAILED DESCRIPTION OF ILLUSTRATIVE EMBODIMENTS

Referring now to the FIGURE, a semiconductor chip 1 is provided with a lower metallization level M1 and a metallization level M2 located above the metallization level M1. The two metallization levels M1, M2 are connected to one another via through-contacts/vias C2.

In one example, the chip includes the metallization levels M0, M1, M2 and DTs (deep trenches), GCs (gate contactors), CGs. In the exemplary embodiment illustrated here, only the M1, M2 levels are shown. For example, the chip can be a trench DRAM (dynamic random access memory). Other chips can also utilize aspects of the invention.

Moreover, programmable links such as fuses and/or anti-fuses 4 are formed in the metallization level M1. A passivation 5, which may be formed as a hard passivation, is located on the inherently fully processed chip 1. However, this passivation 5 and a dielectric 3.1 (e.g., polyimide) are applied to the chip 1 in such a manner that the region of the fuses/anti-fuses 4 is left clear, so that laser treatment thereof is possible.

To ensure that the fuses/anti-fuses 4 do not remain unprotected at the surface following functional completion of the chip 1, a dielectric 3.2 is applied to the fuses. The dielectric layer 3.2 can be processed, for example, as part of the processing of the redistribution layer 2. This is possible because no further treatment of the fuses is required or possible after they have been switched.

At any rate, the invention provides very simple and effective protection for the fuses.

The protection for the fuses/anti-fuses 4 can be realized by means of the following process steps, which are presented in simplified form:

Application of a hard passivation to the chip
Application of a polyimide (dielectric 3.1)
Patterning of the polyimide (opening up of the M2 pads and of the fuses/anti-fuses)
TV etch (where TV stands for terminal via)
Application of a dielectric 3.2
Patterning of the dielectric 3.2
Processing of the redistribution layer (RDL)

The dielectric 3.2 used may be a metal oxide, a silicon oxide, a silicon nitride or a low-K or high-K dielectric or another nonconducting material. A single dielectric is in principle sufficient to protect the fuses/anti-fuses 4. Multiple dielectric layers could alternatively be used.

The redistribution layer 2 is preferably a standard layer structure of Cu/Ni/Au. Other conductors or layer combination of conductors can be used.

What is claimed is:

1. A semiconductor device comprising:
   a fully processed chip that includes metal contacts of an upper metallization level and programmable links, the programmable links serving to activate redundant circuits or chip functions;
   a passivation layer overlying portions of the fully processed chip, the passivation not overlying the metal contacts of an upper metallization level and not overlying the programmable links;
   a dielectric region that overlies at least the programmable links, the dielectric region being laterally spaced from the metal contacts;
   a redistribution layer electrically coupled to the upper metallization level, the redistribution layer arranged over the passivation layer.

2. The semiconductor device according to claim 1, wherein the dielectric region is located between the redistribution layer and the programmable links.

3. The semiconductor device according to claim 1, wherein the redistribution layer comprises a combination of materials including copper, nickel and gold.

4. The semiconductor device according to claim 1, wherein the programmable links comprise fuses.

5. The semiconductor device according to claim 1, wherein the programmable links comprise anti-fuses.

6. The semiconductor device according to claim 1, wherein the passivation layer comprises a hard passivation layer.

7. The semiconductor device according to claim 1, wherein the dielectric comprises a metal oxide.

8. The semiconductor device according to claim 1, wherein the dielectric comprises silicon oxide.

9. The semiconductor device according to claim 1, wherein the dielectric comprises silicon nitride.

10. The semiconductor device according to claim 1, wherein the dielectric comprises a low-K dielectric.

11. The semiconductor device according to claim 1, wherein the dielectric comprises a high-K dielectric.

12. A semiconductor device comprising:
    a semiconductor substrate;
    a first layer of metallization disposed over the semiconductor substrate;
    a plurality of programmable links formed in the first layer of metallization, the programmable links comprising elements selected from the group consisting of fuses and anti-fuses;
    a second layer of metallization disposed over the first layer of metallization, portions of the second layer of metallization being electrically coupled to portions of the first layer of metallization;
    a final passivation layer overlying the second layer of metallization, the final passivation layer not overlying the programmable links;
    a first dielectric region overlying the programmable links, the first dielectric region separate and distinct from the final passivation layer;
    a second dielectric region surrounding the first dielectric region, the second dielectric region separate and distinct from the final passivation layer; and
    a redistribution layer of metal overlying the final passivation layer and electrically coupled to contact portions of the second layer of metallization.

13. The device of claim 12 wherein portions of the second layer of metallization are electrically coupled to portions of the first layer of metallization through contact vias without any intervening metallization layers.

14. The device of claim 12 wherein the redistribution layer of metal comprises a combination of metals including copper, nickel and gold.

15. The device of claim 12 wherein the final passivation layer comprises a passivation layer and an overlying polyimide layer.

16. The device according to claim 12, wherein the first dielectric layer is located between the redistribution layer and the programmable links.

17. An arrangement for protecting fuses/anti-fuses on chips which serve to activate redundant circuits or chip functions, the arrangement comprising:
    a first dielectric region that covers at least a region of programmable links;
    a second dielectric region surrounding the first dielectric region; and
    a passivation layer being disposed on a fully processed chip except for the first dielectric region and except for regions of metal contacts to an upper metallization level.

18. The arrangement according to claim 17, wherein the programmable links comprise fuses.

19. The arrangement according to claim 17, wherein the programmable links comprise anti-fuses.

20. The arrangement according to claim 17, wherein the passivation layer comprises a hard passivation layer.

21. The arrangement according to claim 17, wherein the first or second dielectric comprises a metal oxide.

22. The arrangement according to claim 17, wherein the first or second dielectric comprises silicon oxide.

23. The arrangement according to claim 17, wherein the first or second dielectric comprises silicon nitride.

24. The arrangement according to claim 17, wherein the first or second dielectric comprises a low-K dielectric.

25. The arrangement according to claim 17, wherein the first or second dielectric comprises a high-K dielectric.

* * * * *